United States Patent [19]

Madni

[11] 4,238,727
[45] Dec. 9, 1980

[54] DIGITALLY PROGRAMMABLE APPARATUS FOR GENERATING A SUBSTANTIALLY LINEAR RAMP SIGNAL

[75] Inventor: Asad M. Madni, Los Angeles, Calif.

[73] Assignee: Systron-Donner Corporation, Concord, Calif.

[21] Appl. No.: 972,459

[22] Filed: Dec. 22, 1978

[51] Int. Cl.³ ............................................. G01R 23/16
[52] U.S. Cl. ............................ 324/77 B; 324/77 CS
[58] Field of Search ............... 324/77 R, 77 CS, 77 B, 324/99 D, 77 C

[56] References Cited

U.S. PATENT DOCUMENTS

| | | | |
|---|---|---|---|
| 3,500,183 | 3/1970 | McCutcheon | 324/77 CS |
| 3,729,738 | 4/1973 | Cross et al. | 324/77 CS |

*Primary Examiner*—Michael J. Tokar
*Attorney, Agent, or Firm*—Flehr, Hohbach, Test, Albritton & Herbert

[57] ABSTRACT

A digitally programmable ramp generator produces a substantially linear ramp along with an equivalent digital code by use of a multiplying digital to analog converter which drives an integrator which produces a ramp voltage. This ramp voltage is compared in a feedback circuit with a stairstep ramp (produced by another DAC driven by a counter) and the summed signal is coupled to the reference input of the multiplying DAC so that if there is a difference between the stairstep and the analog ramp the first converter will tend to catch up to the stairstep ramp. Such stairstep ramp is incremented by a comparator which senses when the reference voltage to the multiplying DAC approaches zero; each time this occurs there is an incrementing of the counter. Thus, the digital counter value is equivalent to the value of the analog ramp at any point in time.

8 Claims, 9 Drawing Figures

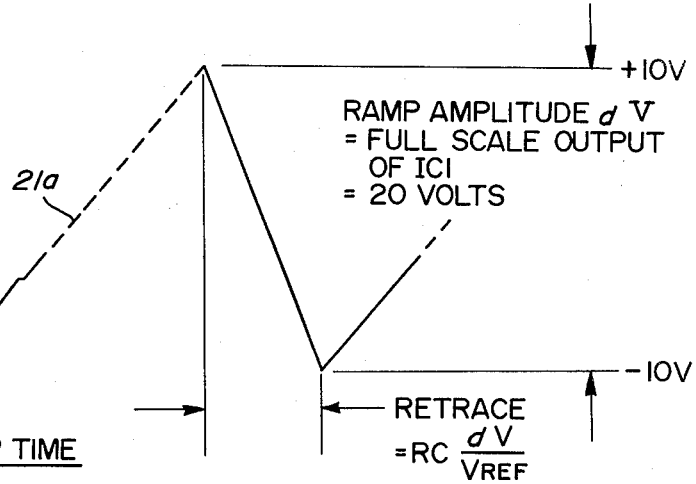
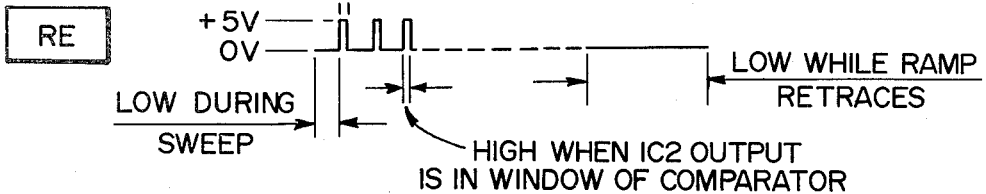

DIGITALLY PROGRAMMABLE APPARATUS FOR GENERATING A SUBSTANTIALLY LINEAR RAMP SIGNAL

The present invention is directed to digitally programmable apparatus for generating a substantially linear ramp signal and more specifically where the ramp signal is used in a spectrum analyzer to drive the swept local oscillator and at the same time provide a digital equivalent ramp code to address a memory matrix of the digital processing portion of the spectrum analyzer.

With the advent of the microprocessor and its accompanying digital logic it is necessary that systems be easily controlled or programmable by digital techniques. For example, in the case of a basic ramp generator which can be used in many applications in swept measurement instrumentation and spectrum analyzers, compromises have been made where it was desired to digitally generate a ramp. For example, a ramp might consist of finite stair steps. With this type of ramp only discrete frequencies would be swept through rather than the continuous full spectrum. On the other hand, generation of a true linear straight line analog ramp would prove to be very difficult to digitally control and provide an equivalent ramp code in a reliable, simple and economical manner.

It is therefore a general object of the present invention to provide a digitally programmable apparatus for generating a substantially linear ramp signal.

It is a more specific object of the invention to provide apparatus as above which is especially suitable in a spectrum analyzer by providing such linear ramp signal to sweep the local oscillator and at the same time an equivalent digital ramp code to address a memory matrix which stores the values of the signal to be analyzed.

In accordance with the objects there is provided apparatus for generating a substantially linear ramp signal comprising a binary counter. A first DAC (digital to analog converter) is driven by the counter. Means increment the counter to produce a stairstep type output signal. A second DAC has a digital input and a reference voltage input and produces an output current proportional to the product of the inputs. Integrator means receive the output current of the second DAC and has as an output the ramp signal. Feedback means sum the ramp signal on the output of the integrator means with the stairstep signal of the first DAC and apply such summed signal as a reference voltage of the second DAC. Comparator means compare the output signal of the integrator means and the stairstep signal and actuate the incrementing means when the absolute values of such signals are substantially equal.

FIGS. 3A through 3D are timing diagrams and waveforms useful in understanding the operation of the circuit of FIG. 2;

Figure 1:
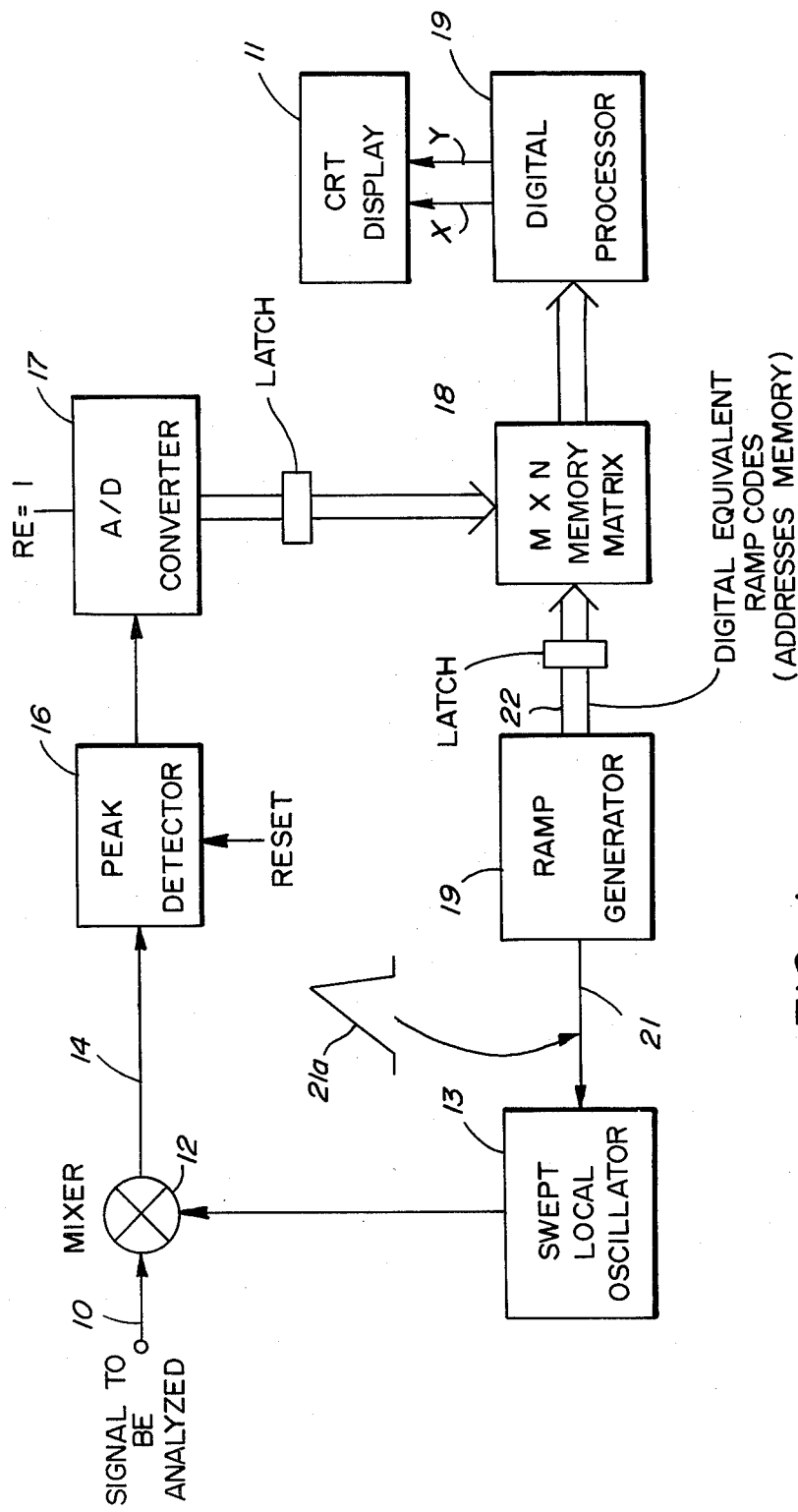
FIG. 1 is a block diagram showing the application of the present invention to a spectrum analyzer having digital storage.

A spectrum analyzer with digital storage is illustrated in FIG. 1 where the signal whose spectrum is to be analyzed is applied at input terminal 10 and a cathode ray tube II provides an XY display where the X axis corresponds to frequency and the Y axis to the magnitude of the various frequency components. Mixer 12 mixes the output of a swept local oscillator 13 with a signal input on terminal 10 to provide on the output line 14 of the mixer an analog signal representative of the magnitude of a particular frequency by which the swept local oscillator is generated. Peak detector 16 senses the highest peak of the various signals presented to it during a predetermined time interval until the value of the peak is read out and converted by a successive approximation analog to digital converter 17 to a digital value which is retained by a latch 15. Then detector 16 is reset. The peak value when converted to a ditital signal is stored in a M by N memory matrix where N corresponds to the Y amplitude axis of the display 11 and M to the X frequency axis. Memory 18 is addressed by a ramp generator 19 which is designed in accordance with the present invention. One output 21 of the ramp generator provides a ramp signal 21a which is a substantially linear analog ramp to sweep the oscillator 13. At the other output 22 the ramp generator provides a digital equivalent ramp code which addresses memory 18 via a latch 20 to store the output of analog to digitan converter 17 in the proper memory location corresponding to the concurrent analog value of the ramp.

Thereafter at an appropriate time a digital processor 9 processes the stored contents of memory 18 to drive CRT display 11. The operation of digital processor 9 is fully disclosed and claimed in a copending application entitled "Apparatus For Connecting Data Points On A Cathode Ray Tube Display and Method Therefore" assigned to the present assignee, in the name of the present inventor, filed Oct. 27, 1978, Ser. No. 955,367.

Figure 2:
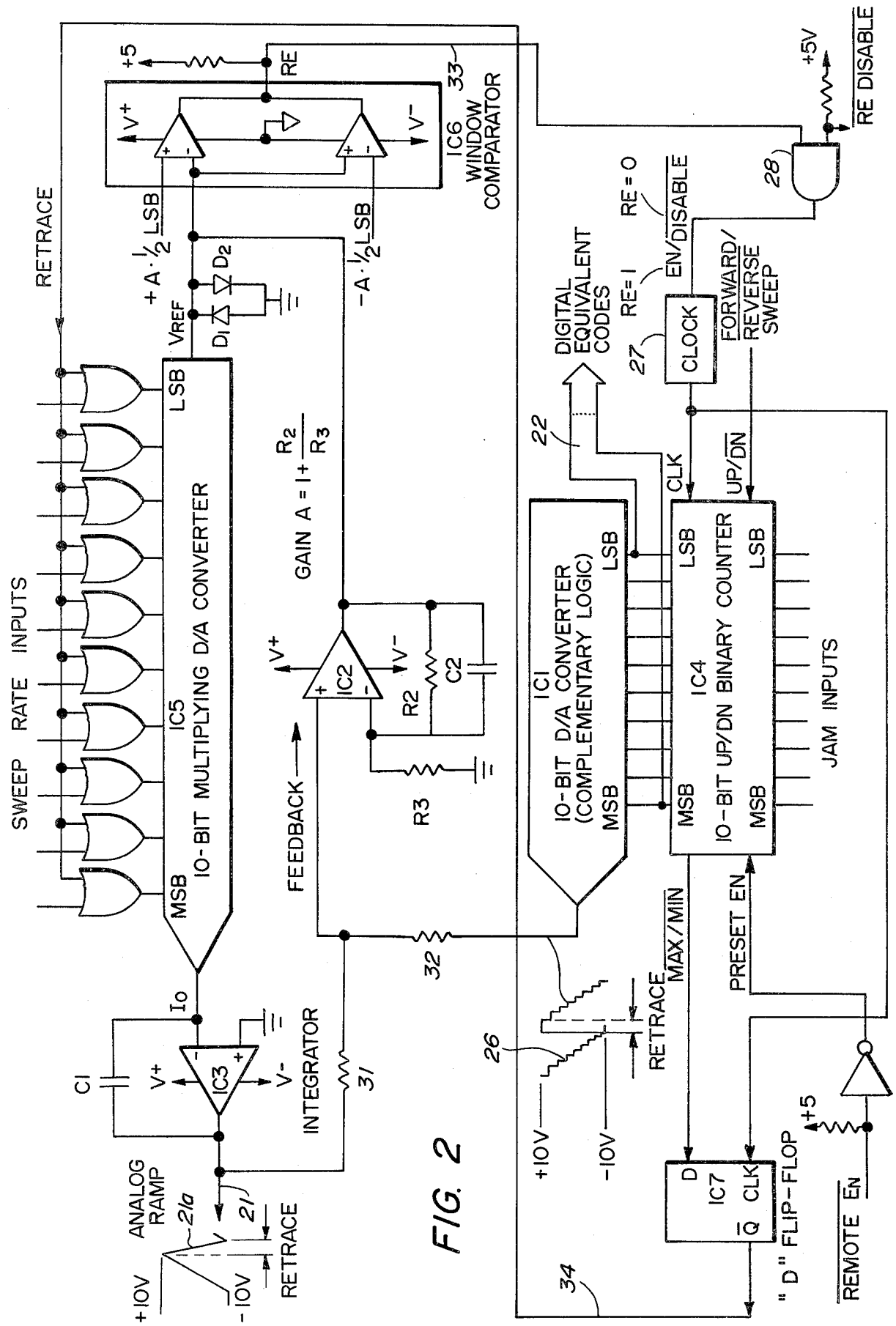
FIG. 2 is a more detailed circuit block diagram showing the logic components of the ramp generator block of FIG. 1.

The detailed logic circuit of the ramp generator 19 of FIG. 1 is illustrated in FIG. 2 where analog ramp 21a is illustrated at output 21 of the digital equivalent ramp code output 22 is shown as being produced by a 10 bit up/down binary counter IC4 (integrated circuit). A first digital to analog converter (DAC) ICI is driven by the output of the counter which, of course, is also the digital code output 22. When the counter is incremented by its least significant bit it counts up in a normal binary manner and causes DAC IC1 to produce a stairstep voltage 26 which in the present embodiment is from $+10$ volts to $-10$ volts since the DAC is of the complementary logic type; i.e., with an all zeroes input it has its maximum output of, in this case, $+10$ volts. Of course, by changing pin connections on ICI the output may be scaled as desired. Then there is a retrace interval which is for the purpose of allowing CRT display 11 (FIG. 1) to retrace. The counter IC4 includes jam inputs which are for the purpose of allowing it to be set at any predetermined count. The counter's clock input is driven by a clock unit 27 which in turn is enabled by an AND gate 28. Thus, the clock 27 and AND gate 28 comprise means for incrementing the counter to cause the converter IC1 to produce the stairstep type output signal 26.

A second digital to analog converter IC5 is of the multiplying type with a plurality of digital sweep rate inputs, so designated, and a $V_{REF}$ input. As is well-known the output $I_o$ of DAC IC5 is $$I_o = \frac{V_{REF}}{R} \cdot \frac{\text{DIGITAL CODE}}{1024} \qquad (1)$$

where R is the nominal resistance seen by $V_{REF}$. Thus, the output current $I_o$ is proportional to the product of the sweep rate input and $V_{REF}$. $I_o$ is coupled to an integrator IC3 having an integrating capacitor C1. Output 21 of the integrator provides the analog ramp voltage 21a. This output is also fed back through resistor 31 to an amplifier IC2 which has a gain, as shown, determined by a ratio of its resistors R2 and R3. The amplifier output is connected to $V_{REF}$. However, summed to analog ramp signal 21a is the stairstep signal 26 through a resistor 32. The analog ramp 21a in the preferred embodiment starts at a −10 volts and goes to +10 volts. Thus the two signals are of opposite polarity and when they are summed, through the equal value resistors 31 and 32, their amplified difference, which approaches zero, is applied as $V_{REF}$. The back-to-back connected diodes D1 and D2 insure that the maximum value of $V_{REF}$ which is 0.7 is maintained at this predetermined value. Alternatively, Zener diodes could be used.

A window comparator IC6 is also connected to the $V_{REF}$ input line to monitor the comparison of the two signals 21a and 26 so that when they approach zero an indication occurs on the line 33 also designated RE. Its windows as indicated, are set at ±A (the gain of IC2) times ½ LSB (the least significant bit of IC1). This provides for an unambiguous signal on line 33. Such RE signal on line 33 increments counter IC4 by means of AND gate 28 of clock 27.

The various waveforms of FIG. 2 are better illustrated in FIGS 3A through 3D where FIG. 3A illustrates the ramp signal 21a, FIG. 3B, the RE output on line 33; FIG. 3C, the stairstep output of DAC IC and 3D the max/min output of counter IC4.

Referring again to FIG. 2 when the counter reachs the maximum of 1024 bits the flip-flop IC7 is actuated by the max/min output to place on the line 34 a retrace signal to thus set the sweep rate input pf DAC IC5 to an all ones code so that the output current of IC5 is maximum. This causes the output of IC2 to be positive making $V_{REF}$ go positive. Thus, the capacitor C1 of the integrator discharges at the maximum sweep rate and fast retrace is achieved. The output of the integrator IC3 goes toward −10 volts during retrace since the output of DAC IC1 is at +10 volts due to the all zeroes code produced by binary counter IC4. When the output of the summing amplifier IC2 is within the window of comparator IC6, the RE on line 33 goes high and the cycle is again repeated.

Such cycle is as follows. Assume that the output of integrator IC3 is initially at −10 volts. If the code applied by the 10 bit up/down binary counter IC is all zeroes, the output of DAC IC1 will be +10 volts and the output of the summing amplifier IC2 will be zero volts. Since the two signals being applied to the feedback circuit are equal and opposite this applies a zero voltage signal to the $V_{REF}$ input of IC5 whose output is given by equation (1). This produces zero output current from IC5 to integrator IC3 whose output thus remains at −10 volts. The feedback loop is in a state of equilibrium and the digital code set by the counter IC4 corresponds to the output 21 of the integrator.

However, since the output of amplifier IC2 is at zero volts, it is within the window of comparator IC6. When this occurs, the output of the comparator on line 33 senses an equal condition and sets RE to 1 which enables AND gate 28 and clock 27. Assuming that the counter IC4 is set at the up counting mode, at the first positive clock transition the output code of the counter goes to count 1 (that is there is a 1 in the least significant bit position). This count is now the new code that converter IC1 sees and it produces at its output a +10 volt less 20 millivolt signal. The output of IC2 immediately goes negative and hence out of the comparator's window making RE go to a logic "0". This disables the clock to the counter so that the counter remains at this count until RE enables the clock 27 again. At the same time the summing amplifier output is applying a negative voltage to $V_{REF}$ of 0.7 volts since it is clamped by the diodes D1 and D2. IC5 now produces a current output as determined by equation (1) where $V_{REF}$ equals 0.7 which makes the capacitor C1 ofintegrator IC3 charge so the difference between the integrator output 21 and the output of the stairstep DAC converter IC1 are within the window of comparator IC6. In other words, their absolute values are substantially equal. Thus, multiplying converter IC5 is continually producing analog ramp segments between counts to catch up with the voltage output of the converter IC1 which is driven by counter IC4. This is illustrated in FIG. 3A where the ramp segments are of 20 millivolt value and there is a flat portion illustrated in FIG. 3B which occurs when RE equals one or is high. That is, when the output signal of IC2 is in the window of the comparator. At this time the counter is stepped another count and the process repeats. Each time as C1 of the integrator IC3 charges, the output of IC2 approaches 0. When the output of IC2 is once again within the window of the comparator, RE goes to a logic 1 enabling the clock and also stepping counter IC4 and causing converter IC1 to go to the next stairstep voltage value. The counter counts all the way to the maximum code of all ones. For each of these codes, the integrator output produces an equivalent analog voltage which is equal and opposite to the output of DAC IC1. While the counter goes from an all zeroes count to an all one count, the integrator output goes from −10 to +10 volts. And, when the counter reaches an all ones count the max/min output is actuated to actuate D flip-flop IC7 for the retrace interval as discussed above. The max/min interval is also illustrated in FIG. 3D which occurs at the end of the count or the stairstep of FIG. 3C.

Figure 4:
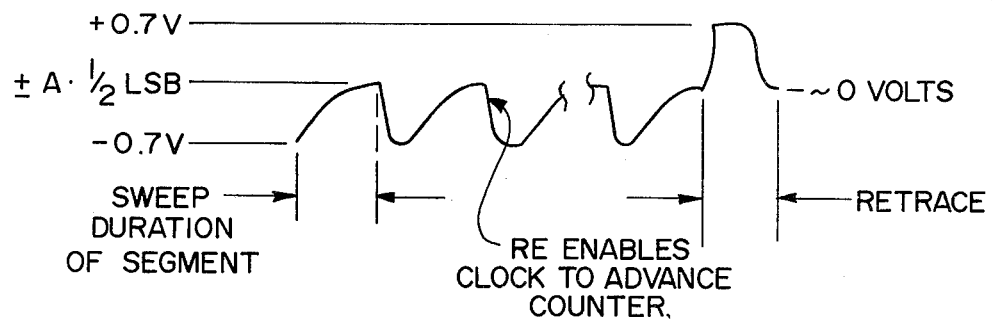
FIG. 4 is a further waveform useful in understanding the operation of FIG. 2.

FIG. 4 better illustrates the operation of the feedback circuit showing the output of IC2, the summing amplifier which is the input to $V_{REF}$. Here for each sweep segment as illustrated in FIG. 3A, the output of IC2 starts at −0.7 volts (as clamped by D1 and D2) and rises as it approaches zero or the window of comparator IC6. Then the RE output is enabled to allow the clock 27 to advance the counter. Finally the retrace interval is also illustrated where a positive $V_{REF}$ voltage occurs. Since the integral of the sweep duration segment of IC2 is substantially linear ramp the successive linear ramp segments as illustrated in FIG. 3A are produced; and the overall ramp is substantially linear to thus simulate a fully analog sweep.

When the ramp generator of FIG. 2 is used in the spectrum analyzer circuit of FIG. 1 for each of the sweep segments between counts of counter IC4 the oscillator 13 is swept through all possible frequencies and peak detector 16 will sense the maximum peak of this segment. When the RE equals one condition occurs the A/C converter 17, as illustrated by the RE equal 1 input, converts this peak value to digital form where it is stored via latch 15 in the memory matrix. The peak detector is reset at this time. Thereafter, by clocking clock 27 the next sweep segment is initiated. In this manner 1,024 peak samples of the input signal to be analyzed are presented in their digital form to the memory matrix along with 1,024 digital equivalent codes from counter IC4 on output 22 which serves as the address to the matrix memory.

Typically in a spectrum analyzer application, the sweep rate inputs to IC5 can be coded for sweep speeds ranging from 10 milliseconds to 10 seconds, in steps of 1, 2, and 5. But 1023 different sweep speeds are possible. Jam inputs of counter IC4 and the remote enable input can be used to manually tune the oscillator.

Figure 6:
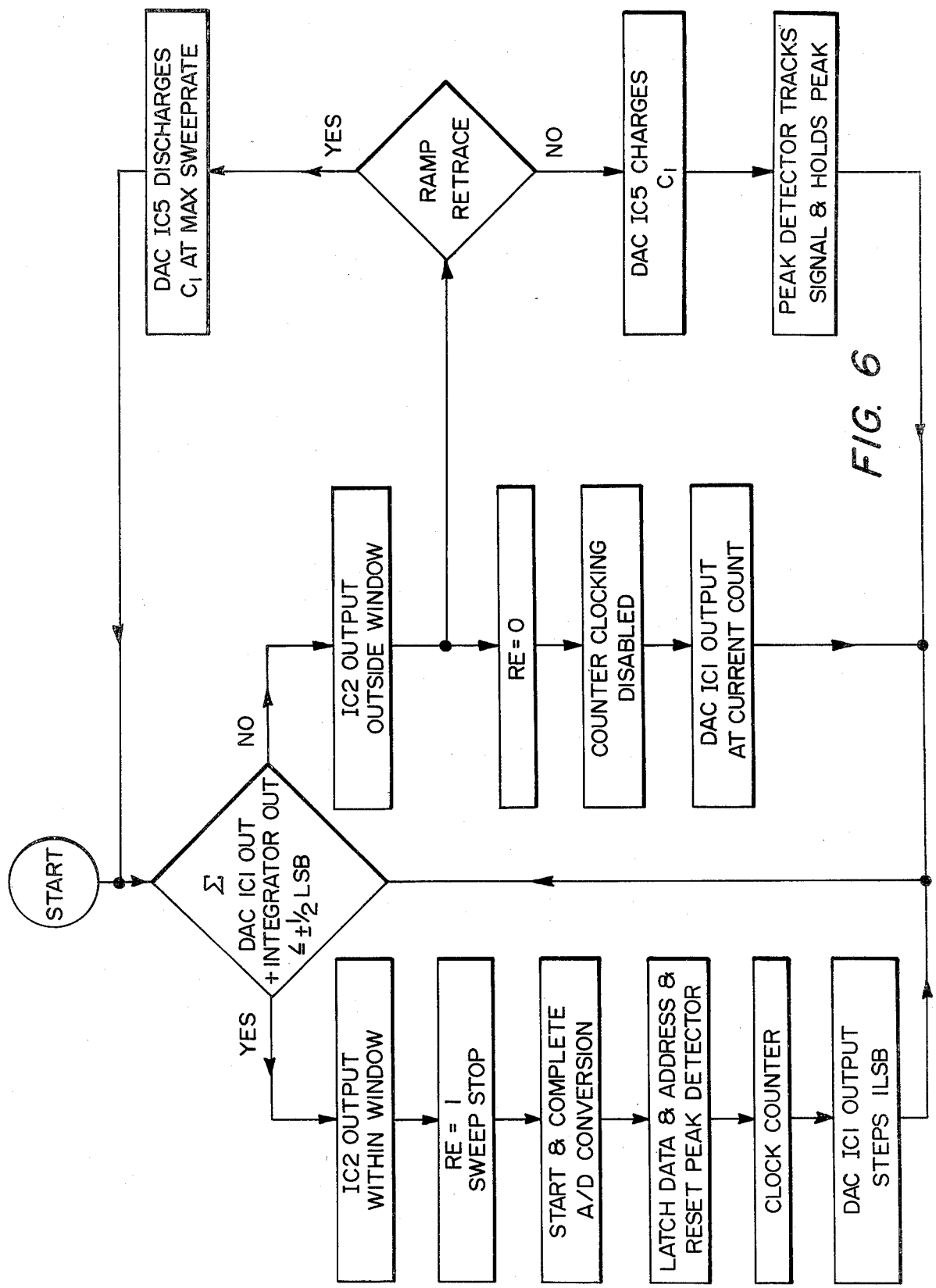
FIG. 6 is a signal flow diagram illustrating the operation of FIG. 2.

The overall operation of the circuit of FIG. 2 as discussed above is also indicated in block form in FIG. 6.

In an alternative embodiment the least significant bit to DAC IC1 can be held high for one set of 512 data values and held low for the nest set of 512 data values allowing the memory matrix to store two separate traces at alternate addresses.

In applications, for example a swept oscillator, that require a forward and reverse sweep mode the counter IC4 can be made to count in a down mode as indicated by this input.

Figure 5:
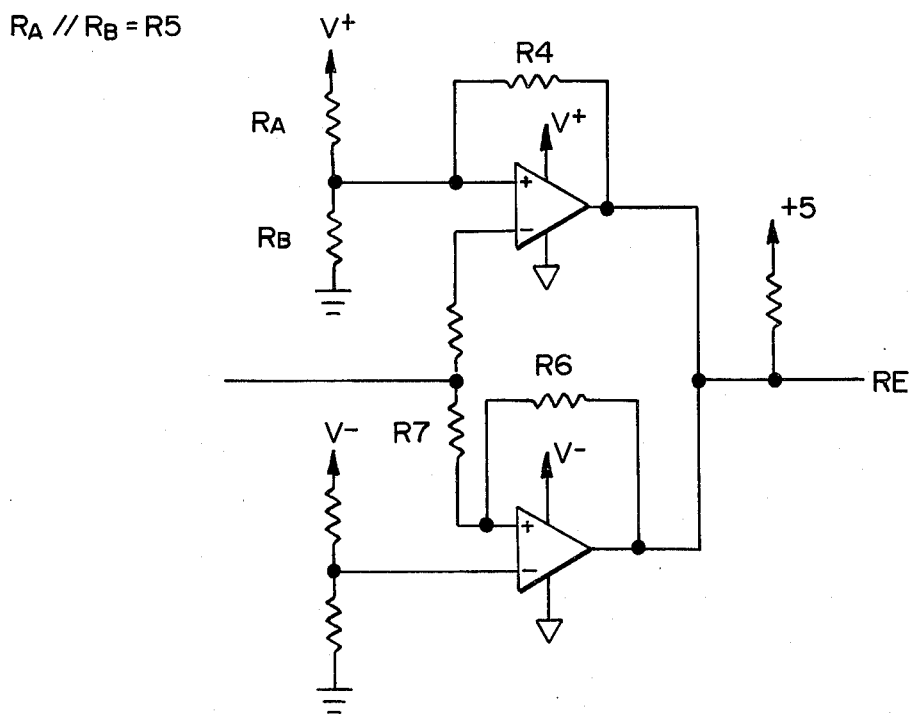
FIG. 5 is a circuit schemmatic of an alternative embodiment of the window comparator of FIG. 2.

Lastly, FIG. 5 is an alternate design of comparator IC6 with hysteresis which may be used in the event of a large amount of noise on the signal when it is passing through the threshold of the window comparator. Hysteresis is generally made somewhat greater than the maximum expected noise. Such hysteresis is provided by using positive external feedback shown by resistors R4 and R6.

In general from a circuit design standpoint, the value of an integrator capacitor C1 is selected based upon the fastest sweep time required. For example, for $-10$ to $+10$ volt ramp whose maximum speed is 10 milliseconds per sweep, C1 may be calculated as $$i = Cl(dv/dt) \qquad (2)$$

where
i = current through the capacitor C1
dv = amplitude of ramp = 20 volts
dt = total time for 1 sweep = 10 msec
Therefore, $$cl = i \frac{dt}{dv} = \frac{V_{REF}}{R} \left( \frac{\text{DIGITAL CODE}}{1024} \right) \left( \frac{10(10^{-3})}{20} \right)$$

if R = 10K, $V_{REF}$ = 0.7 volts and digital code $-1,000$, then $$Cl = \frac{0.7}{10(10^3)} \left( \frac{1000}{1024} \right) \left( \frac{10(10^3)}{20} \right) = .034 \text{ microfarads}$$

Some applications require stopping the sweep at a given point or remotely steppng the sweep. By applying a logic zero to the $\overline{\text{RE DISABLE}}$ input, the clocking to the counter is disabled and the output of the counter remains at its existing count, thus maintaining the output of the integrator constant. Remotely stepping the sweep can be accomplished in the circuit of FIG. 1 by applying a logic zero to the $\overline{\text{REMOTE EN}}$ input and applying the appropriate binary code to the 10 jam inputs of the counter. The code applied to the jam inputs is presented to the DAC IC1 and the clock to the counters is disabled. The output of IC2 supplies the appropriate $V_{REF}$ to IC5 and the output of the integrator goes to equalize itself with the output of DAC IC1 at a rate selected by the sweep rate input code.

Many commercially available DACs may produce unwanted "spike" voltages. Capacitor C2 of IC2 (FIG. 2) may be chosen to limit such spikes; but at the same time the speed and stability of the feedback loop must not be unduly compromised.

Thus, a digitally programmable ramp generator has been provided which produces an analog ramp and its digital equivalent.

What is claimed is:

1. Apparatus for generating a substantially linear ramp signal comprising: a binary counter; a first DAC (digital to analog converter) driven by said counter; means for incrementing said counter to cause said DAC to produce a stairstep type output signal; a second DAC of the multiplying type having a digital input and a reference voltage input and producing an output current proportional to the product of said inputs; integrator means for receiving said output current of said second DAC and having as an output said ramp signal; feedback means for summing the ramp signal on said output of said integrator means with said stairstep signal of said first DAC and applying such summed signal as said reference voltage of said second DAC; and comparator means for comparing said output signal of said integrator means and said stairstep signal and for actuating said incrementing means when the absolute values of such signal are substantially equal.

2. Apparatus as in claim 1 including means for analyzing the frequency spectrum of a signal to be analyzed comprising: a local oscillator swept by said ramp signal; a mixer for mixing the local oscillator output and said signal to be analyzed; a peak detector for receiving and sensing the output of said mixer; an analog to digital converter for converting the value of said peak detector to a digital signal; and a matrix memory for storing said digital signal at an address determined by the concurrent count of said binary counter.

3. Appaaratus as in claim 1 including means for limiting said reference voltage input to a predetermined maximum value.

4. Apparatus as in claim 1 where said ramp signal is of opposite polarity to said stairstep signal and where said comparator means is responsive to said summed signal approaching a zero value.

5. Apparatus as in claim 4 where said comparator means responds to said zero value within a window proportional to the analog value of the least significant bit of said first DAC.

6. Apparatus as in claim 1 wherein said counter includes means for counting in either a forward or reverse direction.

7. Apparatus as in claim 1 where said counter includes jam and disable inputs for stopping said count at any desired value.

8. Apparatus as in claim 1 where said ramp signal produces an effective sweep rate dependent on the magnitude of said output current of said second DAC whereby said sweep rate may be varied between a plurality of values in accordance with the number of binary outputs of said digital input.

* * * * *